United States Patent [19]

Neukomm

[11] Patent Number: 4,636,984
[45] Date of Patent: Jan. 13, 1987

[54] SEMICONDUCTOR DEVICE HAVING NON-VOLATILE STORAGE TRANSISTORS

[75] Inventor: Hans R. Neukomm, Thalwil, Switzerland

[73] Assignee: U.S. Philips Corporation, New York, N.Y.

[21] Appl. No.: 578,442

[22] Filed: Feb. 9, 1984

[30] Foreign Application Priority Data

Feb. 10, 1983 [NL] Netherlands .......................... 8300497

[51] Int. Cl.⁴ ...................... G11C 11/40; H01L 29/78
[52] U.S. Cl. .................................. 365/182; 365/184; 357/23.5
[58] Field of Search ............... 365/104, 182, 184, 185; 357/23.5

[56] References Cited

U.S. PATENT DOCUMENTS 4,266,283 5/1981 Perlegos et al. ..................... 365/104

Primary Examiner—Joseph A. Popek
Attorney, Agent, or Firm—Robert T. Mayer; Steven R. Biren

[57] ABSTRACT

A semiconductor device includes storage cells which have a non-volatile storage transistor and an access transistor connected in series therewith, whereby parts of a word (bytes) can be selected for writing and erasing. By means of a second access transistor, which is added to each storage cell, and by means of switches which are controlled by lines used for driving these second access transistors, the current dissipation is reduced and in non-selected storage cells the potential of the insulated control electrodes of the storage transistors is fixed, as a result of which the risk of undesired change of the information content is reduced.

12 Claims, 4 Drawing Figures

SEMICONDUCTOR DEVICE HAVING NON-VOLATILE STORAGE TRANSISTORS

BACKGROUND OF THE INVENTION

The invention relates to a semiconductor device comprising a matrix of storage cells which are arranged in rows and columns, each storage cell comprising a non-volatile storage transistor and an access transistor connected in series therewith, the storage transistor having an insulated control electrode and the access transistor having an insulated gate electrode, and the gate electrodes of the access transistors of a row of storage cells being connected to an access line common to this row and the access lines being connected to a decoder for driving the access lines with selection signals, whereby the access transistors of a selected row of storage cells are conducting, the access transistors of the remaining rows of storage cells are non-conducting, and each row of storage cells comprises at least two groups of storage cells. In each of these groups the insulated control electrodes are connected to each other and by means of a switch controllable by a common access line to a control line common to a column of groups, and each storage cell at one end of the series arrangement is connected to a first conductor common to column of storage cells and at the other end of the series arrangement being coupled to a second conductor common to at least a column of storage cells.

Such a semiconductor device is known from U.S. Pat. No. 4,266,283. This Patent relates to an electrically alterable read-only memory (EAROM or EEROM), in which the storage transistors are of the type having a floating gate electrode. Via the control lines groups of storage cells or bytes can be selected. The control lines are each connected through a selection switch to a common line to which a control signal is applied. It is determined by means of this control signal whether information can be written, read or erased in the memory.

SUMMARY OF THE INVENTION

The present invention has for its object to provide an improved semiconductor device of the kind described above having a low current dissipation and at most a comparatively small undesired variation of the information content.

The invention is based *inter alia* on the recognition of the fact that preferably current flows from the first conductors through the storage cells to be read to the second conductors only during reading of the information content, while moreover in all the non-selected storage cells, i.e. all the storage cells in which the information is not being written, read or erased, the potential of the control electrodes is fixed at a value which prevents as far as possible any undesired variation of the information content. A suitable value for this potential substantially corresponds to the control signal which is applied to the control electrodes in the reading condition.

According to the invention, a semiconductor device of the kind described above is characterized in that in each of the storage cells in the series arrangement between the first and second conductors there is provided, in addition to the said access transistor, which is referred to hereinafter as first access transistor, and the storage transistor, a second access transistor having an insulated gate electrode, the gate electrodes of the second access transistors of a row of storage cells being connected to a second access line common to this row, the decoder comprising means by which during erasing and writing in each row the first and second access lines are driven with signals complementary to each other and during reading at least in a row selected for this purpose the first and second access lines are driven with signals substantially equal to each other. In each group of storage cells the insulated control electrodes are connected by means of a switch controllable with the second common access line to a point of suitable potential, as a result of which the potential differences occurring across the storage transistor can be limited to values which are smaller than or at most comparable with the values which can occur across the storage transistor in the reading condition.

In an important preferred embodiment, the switches controlled with the second access lines are connected to a second control line common to a column of groups of storage cells, which control line forms part of a connection between these switches and the point of suitable potential.

By the use of the invention, it is achieved in a simple manner that during writing and erasing no current can flow through the storage cells, while nevertheless the first access line can be utilized for the selection of a row of storage cells. During writing and erasing the two access transistors are driven so that one of these transistors is always non-conducting and interrupts the current path through the storage cell. Moreover the driving of the second access transistor is utilized to fix, by means of a further switch, the voltage of the control electrodes of non-selected storage transistors at a predetermined value, which is sufficiently low to prevent or at least to counteract to a considerable extent an undesired change in the information content of non-selected storage transistors.

With the said suitable potential, during operation the potential differences occuring in the non-selected storage cells at the storage transistor are limited to values which are of the order of or smaller than the potential differences occuring at the storage transistor in the reading condition and which are consequently considerably smaller than the potential differences during writing and erasing. These limited values will typically correspond to the values occuring in the reading condition. Depending upon the chosen organization and driving of the storage cells, the limited values can also exceed the values occuring in the reading condition by one or two threshold voltages of the switching transistors used.

The predetermined value of the suitable potential to be applied can be different in the different operating conditions of the matrix. This especially holds when the substrate region of the storage transistors has different potentials in the different operating conditions.

The point of suitable potential is preferably in fact common to all groups of the matrix so that this point of suitable potential is connected to switches of the matrix controllable only by the second access line.

Advantageously, the transistors of the storage cells can be arranged in one or more substrate regions common to at least one storage cell, the substrate regions of a column of groups of storage cells being interconnected or united. Thus, the substrate regions of a column of groups can be commonly driven in a simple manner.

In a further important preferred embodiment, the second conductors of the storage cells of a column of groups are interconnected. The use of such a second conductor common to a column simplifies the required conductor pattern. The second access transistors prevent cross-talk from occuring via this common second conductor between various first conductors.

The common second conductor and the substrate regions of a column of groups of storage cells are preferably interconnected. This means, for example, that the interconnected or united substrate regions may serve at the same time as the second common conductor.

For many applications the suitable potential may advantageously be substantially equal to the potential which is applied in the reading condition to the control electrodes for the storage cells selected for reading. No separate potential value need then be applied or generated for the point of suitable potential.

BRIEF DESCRIPTION OF THE DRAWING

The invention will be described more fully with reference to an embodiment and the accompanying drawing, in which.

DESCRIPTION OF THE PREFERRED EMBODIMENTS

Figure 1:
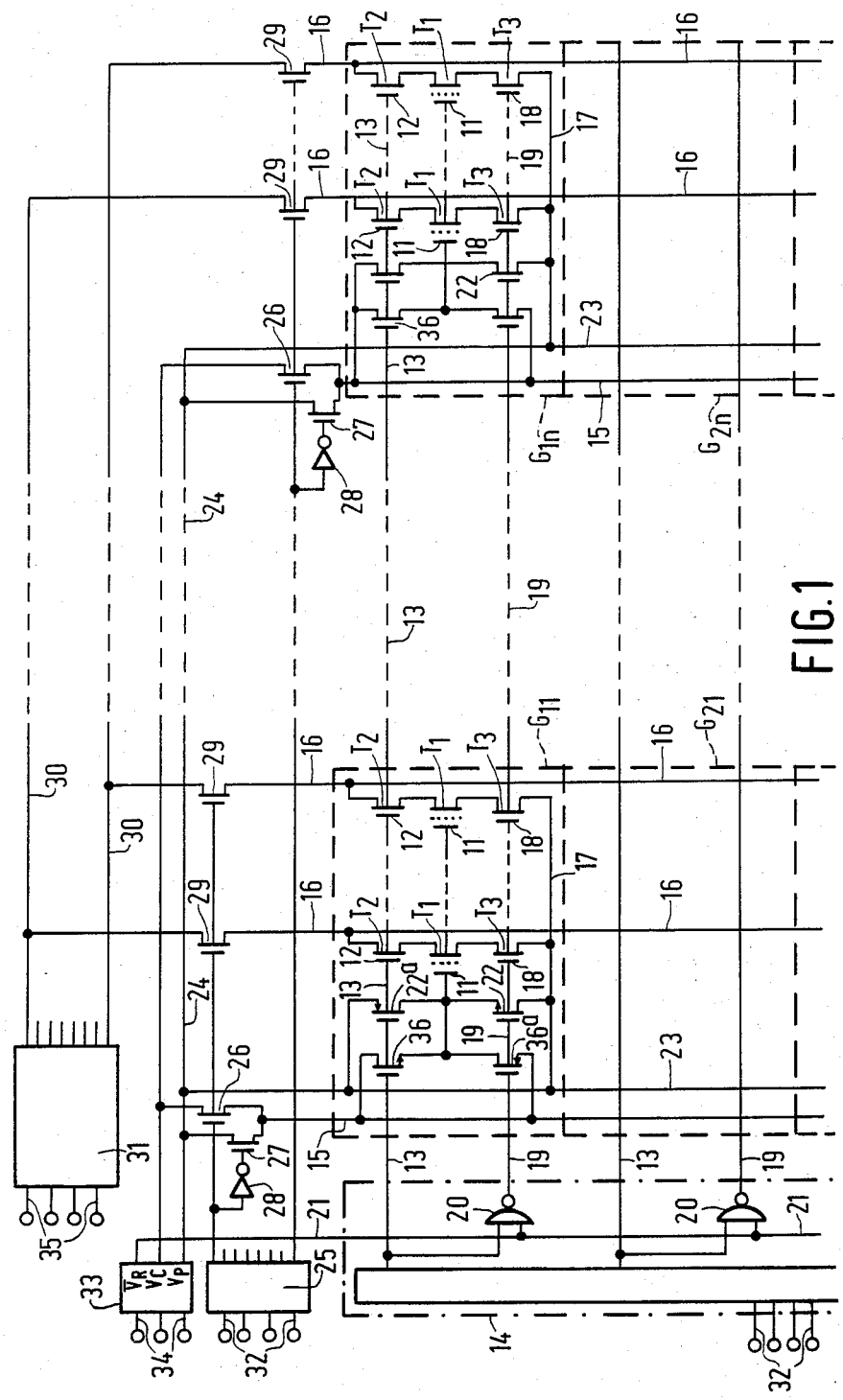
FIG. 1 shows an electric circuit diagram of an embodiment of the semiconductor device according to the invention.

The embodiment relates to a semiconductor device comprising a matrix of storage cells of which a part is shown diagrammatically in FIG. 1. The storage cells are arranged in rows and columns. The matrix may be, for example, a memory matrix or may form part, for example, of a programmable logic matrix known as "programmable logic array".

Each storage cell comprises a non-volatile storage transistor $T_1$ and an access transistor $T_2$ connected in series therewith. The storage transistor $T_1$ has an insulated control electrode 11 and the access transistor $T_2$ has an insulated gate electrode 12, the gate electrodes 12 of the access transistors $T_2$ of a row of storage cells being connected to an access line 13 common to this row. The access lines 13 are connected to a decoder 14 for driving the access lines 13 with selection signals, the access transistors $T_2$ of a selected row of storage cells being conducting, while the access transistors $T_2$ of the remaining non-selected rows of storage cells are non-conducting.

Each row of storage cells consists of at least two groups, for example, $G_{11}$, $G_{1n}$, $G_{21}$, $G_{2n}$, whereby in each of these groups the insulated control electrodes 11 are connected to each other and by means of a switch 36 controllable by the common access line 13 to a control line 15 common to a column of groups $G_{11}$, $G_{21}$ . . . or $G_{1n}$, $G_{2n}$ . . . .

In practice the groups will typically comprise eight storage cells so that in each group one byte of eight information bits can be stored. Depending upon the practical use, however, the groups may alternatively comprise a different number, for example four, sixteen or a larger number of storage cells.

Each storage cell is connected at one end of the series arrangement of the storage transistor $T_1$ and the access transistor $T_2$ to a first conductor 16 common to a column of storage cells and is coupled at the other end of the series arrangement to a second conductor 17 common to at least a column of storage cells. The present embodiment has a second conductor 17 common to all the storage cells of the matrix or at least all the second conductors 17 of the whole matrix are directly connected to each other through the lines 23 and 24.

In accordance with the invention, there is provided in each of the storage cells in the series arrangement between the first and second conductors 16 and 17, respectively (besides the said access transistor $T_2$, which is referred to hereinafter as the first access transistor, and the storage transistor $T_1$) a second access transistor $T_3$ having an insulated gate electrode 18. The gate electrodes 18 of the second access transistor $T_3$ of a row of storage cells is connected to a second access line 19 common to this row. The decoder 14 shown diagrammatically comprises means indicated in FIG. 1 by two input NAND gates 29 to drive during writing and erasing in each row the first and second access lines 13 and 19, respectively, with signals complementary to each other and to drive during reading at least in a row selected or allotted for reading and preferably only in the selected row the first and second access lines 13 and 19, respectively, with signals substantially equal to each other. In the present embodiment, for each row a NAND gate 20 is indicated to which there is applied in addition to the signal supplied to the relevant first access line 13 also a reading command signal $V_R$ via the connection line 21.

In each group $G_{11}$, $G_{1n}$, $G_{21}$, $G_{2n}$ . . . of storage cells the interconnected insulated control electrodes 11 are connected by means of a switch 22 controllable by a second common access line 19 to a point of suitable potential $V_P$ via the lines 23 and 24, which in this embodiment connect the second conductors 17 to each other. The suitable potential $V_P$ is chosen so that the potential differences occuring across the storage transistors $T_1$ in the non-selected rows of storage cells are limited to values which are at most of the same order of magnitude as the values which can occur in the reading condition of a storage cell across the storage transistor of this storage cell to be read.

The device is further provided with a decoder 25 for selecting a column of groups of storage cells $G_{11}$, $G_{21}$ . . . or $G_{1n}$, $G_{2n}$ . . . , whereby, for example, by means of switches 26 and 27 and inverters 28 a potential $V_C$ is applied to a selected control line 15 and the aforementioned suitable potential $V_P$ is applied to the remaining non-selected control lines 15.

This particular embodiment has the additional advantage that a given fixed potential is applied not only to the control electrodes 11 in non-selected rows but also to the control electrodes 11 in the non-selected groups of the selected rows, which potential keeps the potential differences across the non-selected storage transistors $T_1$ limited.

The first conductors 16 may all be connected to an amplifier for reading information and supplying information to be written. Alternatively, as in the present embodiment, only the first conductors 16 of the selected column of groups of storage cells may be connected via switches 29 driven by the decoder 25 to lines 30 and amplifiers 31. The number of lines 30 is then equal to the number of storage cells per group $G_{11}$, $G_{21}$ . . . .

The decoders 14 and 25 have connections 32 for supply and for applying address information. The decoder 33 has connections 34 for supply and for signals with which the desired operating condition, such as reading, writing and erasing, is indicated. This decoder 33 generates in otherwise known manner the desired potentials $V_C$, $V_P$ and $\overline{V_R}$.

The amplifiers 31 have connections 35 for supply and for input and output of information signals.

It should be appreciated that the matrix of storage cells, instead of being driven by decoders 14, 25 and 33 and amplifiers 31, may alternatively be driven in a different known manner. Within the scope of the present invention, it is of particular importance that the storage cells have a second access transistor $T_3$ and a second access line 19 which during writing and erasing is driven with the first access line 13 in phase opposition and by which a further switch 22 is actuated. In this manner, it is achieved that during writing and erasing no current flows through the storage cells and the control electrodes 11 of the storage transistors in non-selected storage cells are kept at a suitable potential.

The storage transistors $T_1$ may be of any usual type. They may have a floating gate electrode, as in U.S. Pat. No. 4,266,283 or in I.E.E.E. Journal of Solid-State Circuits, Vol. SC-7 No. 5, October 1972, p. 369-375, in which tunneling or avalanche breakdown is used. The storage transistors $T_1$, however, are preferably of the type having a dielectric layer in which charge can be stored in a non-conducting intermediate layer, the quantity of stored charge determining the information content of the storage transistor. Examples of such storage transistors are described inter alia in I.E.E.E. Transaction on Electron Devices, Vol. ED-27 No. 1, January 1980, p. 266-276, the international Patent Application published under number WO 82/02275 and the non-prepublished Dutch Patent Application No. 8200756, which corresponds to U.S. Pat. No. 4,586,065.

When realized by the known process of manufacturing field effect transistors having self-aligned insulated gate electrodes, the access transistors $T_3$ and the access line 19 need occupy only little additional area at the semiconductor surface, i.e. little more area than the area occupied by the conductor track which constitutes the access line 19 and the gate electrode 18. When storage transistors $T_2$ which charge storage in the gate dielectric are used, the three transistors $T_1$, $T_2$ and $T_3$ can moreover be united to a structure having two source and drain zones, between which the three channel regions adjoin each other directly, so that in fact a single transistor having three insulated gate electrodes is obtained.

The access transistors $T_2$ and $T_3$ need not necessarily be arranged on the side opposite the storage transistor $T_1$, but the storage transistor $T_1$ may be connected on one side directly to the first or the second conductors 16 or 17, while the other side is connected to the series arrangement of the access transistors $T_2$ and $T_3$. Especially with storage transistors $T_1$ in which charge is stored in the gate dielectric, however, the arrangement with the transistor $T_1$ at the center is to be preferred because then the access transistor $T_3$ can be connected on the side connected to the second conductor directly to the semiconductor substrate region in which the transistors $T_1$, $T_2$ and $T_3$ are arranged.

The switches 22 and 36 are preferably constructed as known transmission gates which each comprise two complementary transistors 22 and 22a and 36 and 36a, respectively, which are driven in phase opposition and whose main current paths are connected parallel to each other. As is known, signals can be passed on through transmission gates in both directions substantially without loss of voltage.

Also the switches 26 and 27 are preferably constructed as transmission gates. The switches 22, 26, 27 or 36 may, however, also be constructed as single transistors, for example, as insulated gate field effect transistors of the same conductivity type as the access transistors $T_2$ and $T_3$.

Taking into account, as the case may be, the potential of the substrate region in which the access transistors $T_2$ and $T_3$ are arranged (back-gate voltage), these transistors will mostly be of the enhancement type. The single switching transistors 22, 26, 27, 29 and 36 will have a suitably-chosen threshold voltage at which the switching transistors 22, 27 and 29 may be of the enhancement type and the switching transistors 26 and 36 are preferably of the depletion type in order to prevent the transmitted voltage from being a threshold voltage lower than the voltage applied to be transmitted. However, it may then be desirable to adapt, for example, the voltages supplied by the decoders 14 and 25. In the embodiment described, due to the fact that the most negative voltages of the decoders 14 and 25 are chosen to be at least an amount equal to the threshold voltage of the switching transistor 26 and 36 of the depletion type more negative than the most negative value of the voltages $V_C$ and $V_P$, in this case it can be ensured that the switching transistors 26 and 36 of the depletion type are switched into the non-conducting state.

With transmission gates, the control electrodes of the two parallel-connected complementary transistors are driven in phase opposition in the usual manner. The transistors are then either both conducting or both non-conducting.

With the transmission gates, 22, 22a and 36, 36a, the control signals are in phase opposition during writing and erasing. During reading, however, the control signals at the lines 13 and 19 in the selected row are substantially equal to each other. This means that in both transmission gates one transistor is conducting and one transistor is non-conducting. This situation can be allowed if during reading $V_C = V_P$ and this voltage is unequal to the voltage at the control electrodes of the conducting transistors.

In the present embodiment, the storage and access transistors $T_1$, $T_2$ and $T_3$ are n-channel transistors and voltages of, for example, about $+5$ V and about $-10$ V are applied to the access lines. During reading, $V_C$ and $V_P$ are both about 0 V. In the selected row, the transistors $T_2$ and $T_3$ and the n-channel switches 22 and 36 have a gate voltage of about 5 V so that they are conducting and the aforementioned condition is satisfied.

The semiconductor device has a common semiconductor body 40 (FIGS. 2 to 4) with, for example, an n-type silicon substrate 41 having a resistivity of 3 to 6 $\Omega$.cm. In this n-type substrate 41 p-type substrate regions 42 and 43 are formed in known manner. The part shown in FIG. 2 of the semiconductor device has a substrate region 42 which is common to the storage cells of two adjacent groups belonging to different rows, but to the same column. In this substrate region, the relevant transistors $T_1$, $T_2$ and $T_3$ are provided in the form of n-channel insulated gate field effect transistors. The transistors $T_3$ of the two adjacent groups have a common n-type source region 17. Further n-type source and drain regions of the transistors $T_1$, $T_2$ and $T_3$ are designated by 44, 45 and 46.

The semiconductor body is provided with a pattern of insulating material 47, which serves as field insulation. It may consist, for example, of silicon oxide and may be obtained by local oxidation of the semi-conductor body 40. The pattern of insulating material defines active regions at the surface 48 of the semiconductor body in which switching elements are provided. Below the pattern of silicon oxide 47 more highly doped p-type channel stoppers 49 can be provided in the p-type regions 42 and 43 and more highly doped n-type channels stoppers 50 can be provided in the n-type substrate 41.

On the semiconductor surface 48 there is provided in the active regions below the gate electrodes 11 of the storage transistors $T_2$ a dielectric in which charge can be stored in a usual manner. In the present embodiment, this dielectric has a thin silicon oxide layer 51 and a silicon nitride layer 52, the silicon nitride layer 52 being a common layer which is located below the whole conductor track 53 which constitutes the gate electrodes 11 of the storage transistors $T_2$ of a group of storage cells and connects them to each other.

Figure 2:
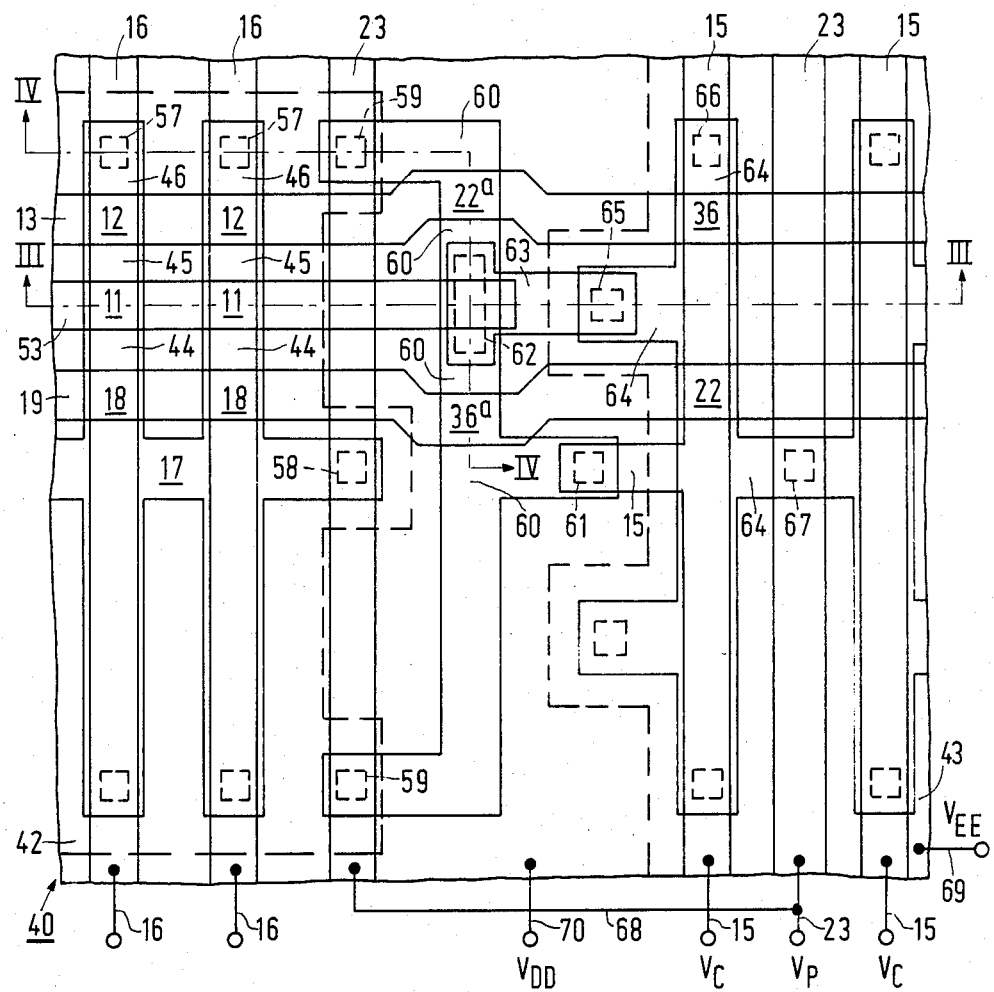
FIG. 2 shows diagrammatically a part of a plan view of this semiconductor device.
Figure 3:
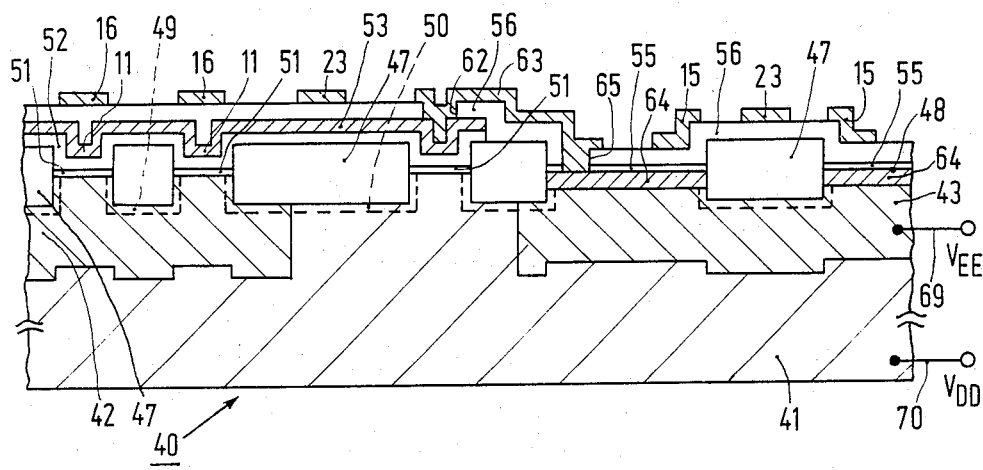
FIG. 3 and FIG. 4 are diagrammatic sectional views taken on the lines III—III and IV—IV, respectively, of FIG. 2.
Figure 4:
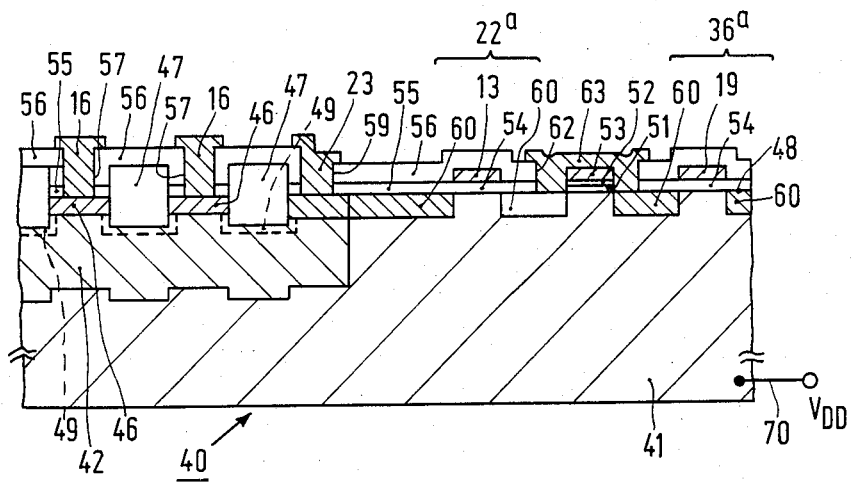

Further, FIGS. 2 and 4 indicate the access lines 13 and 19 which are constituted by conductor tracks and are each common to a whole row of storage cells. In the active regions of the storage cells they form gate electrodes 12 and 18, respectively, which are separated from the semiconductor surface 48 by a gate dielectric 54. The source and drain regions of the various transistors are covered with an insulating layer 55. This insulating layer 55 and the gate dielectric may consist, for example, of silicon oxide.

The conductor tracks 13, 19 and 56, which may consist, for example, of polycrystalline semiconductor material and/or of a suitable metal silicide, are covered with an insulating layer 56. The conductor tracks 13, 19 and 56 belong to a first layer which is separated by the insulating layer 56 from a second layer of conductor tracks to which belong the conductor tracks 15, 16 and 23. The conductor tracks of this second layer may consist of a suitable materal, such as, for example, aluminum.

The n-type drain regions 46 of the transistors $T_2$ of the storage cells are connected through windows 57 in the insulating layers 55 and 56 to the conductor tracks 16 which constitute first conductors or bit lines common to a column of storage cells. The common second conductors 17 are connected through windows 58 to the lefthand connection line 23. This lefthand connection line 23 is further connected through windows 59 to the p-type substrate region 42. The lefthand connection line 23 connects the substrate regions 42 of a column of groups to each other and to the point of suitable potential $V_p$. Between the p-type substrate regions 42 and 43 there are provided in the n-type substrate 41 two p-channel field effect transistors 22a and 36a for each group of storage cells. These p-channel transistors have p-type source and drain electrode zones 60, of which one adjoins the p-type substrate region 42 and is connected through the window 59 to the lefthand connection line 23. The other end of the series arrangement of these two transistors is connected through a window 61 to a connection line 15. The two transistors are connected in series by means of a window 62, which overlaps the conductor track 53 and partly exposes the electrode zones 60 adjoining this track on both sides and a conductor track 63 which belongs to the second layer of conductor tracks and extends into this window 62.

In the p-type substrate region 43 the switches 22 and 36 are arranged in the form of n-channel insulated gate field effect transistors. The substrate region 43 may be a continuous region which extends in the column direction and in which all the switches 22 and 36 for two columns of groups of storage cells can be accomodated. The righthand connection line 23 extends across the center of this region 43. The center line of this righthand connection line 23 can be a mirror axis, whereby the column of groups of storage cells indicated in FIG. 2 on the lefthand side of this center line can be repeated in a mirror image on the righthand side of the center line.

The n-channel transistors 22 and 36 have n-type electrode zones 64, the central zone 64 of the series arrangement of the two n-channel transistors adjoining through a window 65 the conductor track 63. At one end of this series arrangement the relevant electrode zone 64 is connected through a window 66 to a connection line 15. At the other end the relevant electrode zone 64 is connected through a window 67 to the righthand connection line 23.

It is indicated diagrammatically by the connection 68 that the lefthand and righthand connection lines 23 are interconnected. The voltage $V_p$ is applied to these lines. In the selected condition, the voltage $V_C$ is applied to the lines 15, while in the non-selected condition the voltage $V_P$ is applied to these lines.

The substrate region 43 is provided with a connection 69 (shown diagrammatically) to which a negative supply voltate $V_E$ of, for example, about $-10$ V is applied. The substrate 41 has a connection 70 (shown diagrammatically) for a positive supply voltage $V_{DD}$ of, for example, about $+5$ V.

The remaining parts (shown in FIG. 1) of the device, such as the decoders 14, 25 and 33 and the amplifier 31, may be integrated in a usual manner in the same semiconductor body 40 together with the storage matrix. These parts are preferably realized using CMOS technology.

The device described can further be operated in a usual manner. Further details in this respect can be derived, for example, from the first-mentioned Dutch Patent Application No. 8200756.

Further, the device described can be manufactured entirely in a conventional manner. *Inter alia* the method can be used which is described in Dutch Patent Application No. 8200756, in which the silicon nitride layer 52, as proposed therein, can be subdivided into separated parts which are located exclusively below the gate electrodes 11 above the channel region of the storage transistors. Further, the relevant etching treatment of the silicon nitride preceding the application of the first layer of conductor tracks and the subsequent oxidation treatment may be omitted, in which event a continuous silicon nitride layer 52 is obtained.

For the sake of completeness, it should be noted that the contents of U.S. Pat. No. 4,586,065, corresponding to the aforementioned Dutch Patent Application No. 8200756, is considered to be incorporated by reference in the present Patent Application.

It will be appreciated that the present invention is not limited to the embodiment described, but that within the scope of the invention many variations are possible. For example, instead of MNOS transistors other storage transistors may be used, which have a dielectric which separates the control electrode from the semiconductor body and in which charge can be trapped and stored in a non-conducting intermediate layer separated from the control electrode and the semiconductor body, the quantity of stored charge determining the information content of the storage transistors. The intermediate layer may be located at or near the junction layer between two insulating layers of different compositions, whereby these two insulating layers may comprise, instead of oxide and nitride, for example, also silicon oxide and aluminum oxide. Further, one or both insulating layers may be oxynitride layers. Furthermore, the dielectric may comprise these two or also more than two layers. Alternatively, a dielectric having an intermediate layer with trapping center may be realized in a different manner, for example, by incorporating semiconductor particles or suitable atoms and/or ions.

In the embodiment described, all the second conductors 17, all the substrate regions of the storage cells and one side of all the second access transistors $T_3$ are connected to each other and to the point of suitable potential. It will be appreciated that this offers advantages and has a favorable influence, for example on the packing density. However, depending *inter alia* upon the type of storage transistor used and the desired organization and drive of the matrix, other arrangements may be efficacious. The connection between the switches 22 controllable by the second access line 19 and the point of suitable potential preferably includes second control lines 23 at least common to a column of groups of storage cells. Further, the first and second conductors may serve as a first and second bit line, respectively, whereby the second conductors may have the form of a conductor track extending in the column direction or of a substrate region which is common to a column of storage cells and in which the transistors of this column are accomodated. The second conductors of a column of groups of storage cells are preferably connected to each other, however, and form a connection line common to such a column.

If the substrate regions of a column of groups of storage cells are interconnected or united, these interconnected substrate regions or this common substrate region may serve, for example, as second control line and/or as common connection line.

In the embodiment, the suitable potential $V_P$ is applied both to the substrate regions 42 and to the non-selected control electrodes 11. The potential difference across the dielectric of the MNOS transistors is consequently equal to zero in the non-selected condition, as a result of which the risk of undesired change or attack of the information content of non-selected MNOS transistors is a minimum. Since the command signal $V_C$ in the reading condition is equal to $V_P$, the potential difference across the dielectric in non-selected MNOS transistors is limited to the value of this potential difference in MNOS transistors selected for reading information.

As stated, storage transistors of any known type may be used. The term storage transistors is then to be understood to mean any structure which contains a storage site having a semiconductor region and a control electrode separated therefrom by a dielectric, in which dielectric charge can be stored either in that a so-called floating electrode is arranged in the dielectric or in that an intermediate layer is present in the dielectric, in which charge carriers can be trapped and stored, whereby the semiconductor region is included as channel region in a field effect transistor structure and the threshold voltage in the channel region is variable with the quantity of stored charge. The channel region may directly adjoin source and drain electrode zones of the field effect transistor structure and may also adjoin at one or both ends a further channel region of the field effect transistor structure which is controllable by a further gate electrode.

In the non-selected storage cells, by means of the second access transistor, of the switch controllable by the second access line and of the suitably chosen potential, especially the potential difference across the dielectric or the part of the dielectric of the storage transistor, through which during writing and erasing charge transport takes place in order to change the information content, is defined more accurately and/or limited to a value at which substantially no change of the information content can occur.

The conductivity types indicated in the embodiment may be interchanged, whereby the indicated voltages are adapted correspondingly. Instead of silicon, germanium or an $A^{III}B^V$ compound may be used as semiconductor material.

The insulating layer 47 serving as field insulation may be obtained by usual methods other than local oxidation or may be replaced by another form of field insulation. The polysilicon conductor tracks 13, 53 and 19 may be replaced entirely or in part by conductor tracks of a suitable metal, such as molybdenum, or a suitable metal silicide.

What is claimed is:

1. A semiconductor device comprising a matrix of storage cells which are arranged in rows and columns, and a common access line for each row, each storage cell comprising a non-volatile storage transistor and a first access transistor connected in series therewith, the storage transistor having an insulated control electrode and the first access transistor having an insulated gate electrode, the gate electrodes of the first access transistors of a row of storage cells being connected to the common access line for this row, a decoder for driving the access line, the access lines being connected to said decoder for driving the access lines with selection signals, whereby the first access transistors of a selected row of storage cells are conducting and the first access transistors of the remaining rows of storage cells are non-conducting, each row of storage cells comprising at least two groups of storage cells, in each of these groups the insulated control electrodes being connected to each other and by means of a switch controllable by said common access line to a control line common to a column of groups, and each storage cell at one end of a series arrangement being connected to a first conductor common to a column of storage cells and at the other end of the series arrangement being coupled to a second conductor common to at least a column of storage cells, characterized in that in each of the storage cells in the series arrangement between the first and second conductors there is provided a second access transistor having an insulated gate electrode, the gate electrodes of the second access transistors of a row of storage cells being connected to a second access line common to this row, the decoder comprising means by which during erasing and writing in each row the first and second access lines are driven with signals complementary to each other and during reading at least in a selected row the first and second access lines are driven with signals substantially equal to each other, while in each group of storage cells the insulated control electrodes are connected by means of a switch controllable with the second common access line to a selected potential such that the potential differences occurring across the storage transistor can be limited to values which are substantially not greater than the values which can occur across the storage transistor in the reading condition.

2. A semiconductor device as claimed in claim 1, characterized in that the connection between the switches controllable by the second access line and the selected potential includes a second control line common to a column of groups of storage cells.

3. A semiconductor device as claimed in claim 2, characterized in that the connection between said switches and the selected potential is common to all groups of storage cells.

4. A semiconductor device as claimed in claim 1, 2 or 3, characterized in that the transistors of the storage cells are provided in at least one substrate region common to at least one storage cell, whereby the substrate regions of a column of groups of storage cells are connected to each other.

5. A semiconductor device as claimed in claim 1, 2 or 3, characterized in that the second conductors of the storage cells of a column of groups are connected to each other.

6. A semiconductor device as claimed in claim 4, characterized in that the substrate regions and the second conductors of a column of groups of storage cells are connected to each other.

7. A semiconductor device as claimed in claim 4, characterized in that the interconnected substrate regions are connected to said selected potential.

8. A semiconductor device as claimed in claim 1, 2 or 3, characterized in that the selected potential is substantially equal to the potential which in the reading condition is applied to the control electrodes of the storage transistors of the storage cells selected for reading.

9. A semiconductor device as claimed in claim 1, 2 or 3, characterized in that all the second conductors and all the substrate regions of the storage cells are connected to each other.

10. A semiconductor device as claimed in claim 1, 2 or 3, characterized in that the storage transistors have a dielectric which separates the control electrode from the semiconductor body and in which charge can be trapped and stored in a non-conducting intermediate layer separated from the control electrode and the semiconductor body, the quantity of stored charge determining the information content of the storage transistor.

11. A semiconductor device as claimed in claim 1, 2 or 3, characterized in that the control lines are connected to means for selecting a control line and for supplying thereto a command signal and for applying said selected potential to non-selected control lines.

12. A semiconductor device as claimed in claim 1, 2 or 3, characterized in that the switches controllable by the first and second access lines are constructed as transmission gates.

* * * * *